(12) United States Patent
Tabatake

(10) Patent No.: US 12,740,280 B2
(45) Date of Patent: Sep. 15, 2026

(54) DISPLAY DEVICE

(71) Applicant: Magnolia White Corporation, Tokyo (JP)

(72) Inventor: Hiroshi Tabatake, Tokyo (JP)

(73) Assignee: MAGNOLIA WHITE CORPORATION, Tokyo (JP)

(*) Notice: Subject to any disclaimer, the term of this patent is extended or adjusted under 35 U.S.C. 154(b) by 0 days.

(21) Appl. No.: 18/633,731

(22) Filed: Apr. 12, 2024

(65) Prior Publication Data

US 2024/0268174 A1 Aug. 8, 2024

Related U.S. Application Data

(63) Continuation of application No. 18/457,342, filed on Aug. 29, 2023, now Pat. No. 11,997,907, which is a (Continued)

(30) Foreign Application Priority Data

Dec. 24, 2021 (JP) ................................ 2021-210887

(51) Int. Cl.
*H10K 59/35* (2023.01)
*H10K 50/84* (2023.01)
*H10K 59/123* (2023.01)

(52) U.S. Cl.
CPC ......... *H10K 59/353* (2023.02); *H10K 50/841* (2023.02); *H10K 59/123* (2023.02)

(58) Field of Classification Search
CPC .. H10K 59/122; H10K 59/123; H10K 59/124; H10K 59/353
See application file for complete search history.

(56) References Cited

U.S. PATENT DOCUMENTS

2005/0023969 A1* 2/2005 Omata ................. H10K 59/122 313/506
2009/0009069 A1* 1/2009 Takata ................. H10K 59/122 445/24

(Continued)

FOREIGN PATENT DOCUMENTS

KR 20200137847 A 12/2020

OTHER PUBLICATIONS

Japanese Office Action issued Aug. 5, 2025, in corresponding Japanese Patent Application No. JP Application No. 2021-210887, 22pp.

(Continued)

*Primary Examiner* — Steven B Gauthier
*Assistant Examiner* — E. Rhett Cheek
(74) *Attorney, Agent, or Firm* — XSENSUS LLP

(57) ABSTRACT

According to one embodiment, a display device includes a substrate, a pixel circuit, an insulating layer including a contact hole, a lower electrode connected to the pixel circuit via the contact hole, an upper electrode, an organic layer between the lower electrode and the upper electrode, a rib formed of an inorganic material and including an aperture, and a partition above the rib. The organic layer includes a first organic layer in contact with the lower electrode via the aperture and a second organic layer located on the partition and spaced apart from the first organic layer. The partition overlaps an entire of the contact hole in plan view.

20 Claims, 6 Drawing Sheets

Related U.S. Application Data continuation of application No. 18/085,618, filed on Dec. 21, 2022.

(56) References Cited

U.S. PATENT DOCUMENTS

| | | | | |
|---|---|---|---|---|
| 2012/0217516 | A1* | 8/2012 | Hatano | H10K 59/122<br>257/E33.062 |
| 2012/0228603 | A1 | 9/2012 | Nakamura | |
| 2013/0020564 | A1* | 1/2013 | Kobayashi | H10K 59/173<br>438/46 |
| 2013/0187177 | A1* | 7/2013 | Nanai | H10K 59/124<br>438/34 |
| 2016/0124557 | A1 | 5/2016 | Choi | |
| 2017/0278909 | A1 | 9/2017 | Jeon et al. | |
| 2019/0348482 | A1* | 11/2019 | Bae | H10K 59/124 |
| 2020/0091259 | A1 | 3/2020 | Han et al. | |
| 2021/0257423 | A1 | 8/2021 | Furuie | |
| 2022/0077251 | A1* | 3/2022 | Choung | H10K 59/80522 |
| 2025/0366318 | A1* | 11/2025 | Jo | H10K 59/124 |

OTHER PUBLICATIONS

US Office Action issued Dec. 8, 2025, in corresponding U.S. Appl. No. 18/085,618, 30pp.

US Office Action issued Jun. 11, 2025, in corresponding U.S. Appl. No. 18/085,618, 28pp.

Office Action, IN Application No. 202214073952, Nov. 6, 2025, 7 pages.

Office Action mailed Apr. 2, 2026, in Chinese Application No. 202211622563.5, 31 pages including English translation.

* cited by examiner

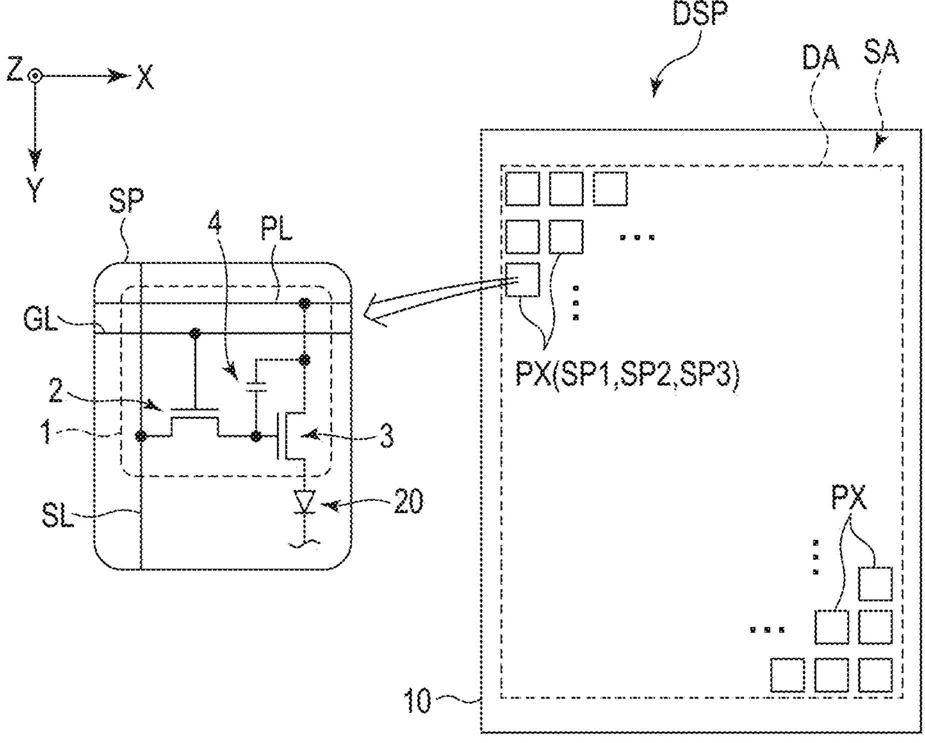
F I G. 1

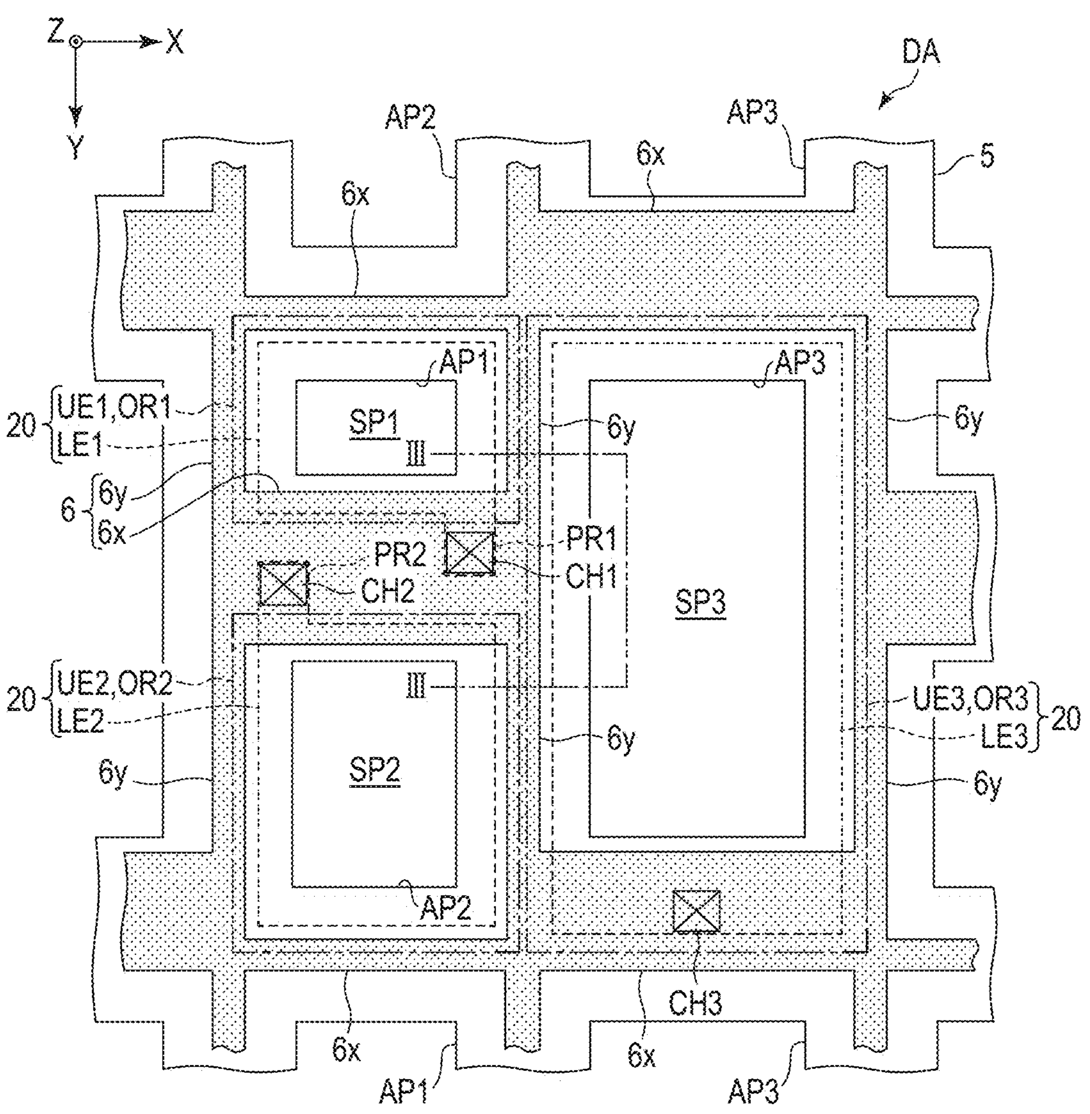
F I G. 2

DISPLAY DEVICE

CROSS-REFERENCE TO RELATED APPLICATIONS

This application is a continuation of U.S. application Ser. No. 18/457,342, filed Aug. 29, 2023, which is a continuation of U.S. application Ser. No. 18/085,618, filed Dec. 21, 2022, which is based upon and claims the benefit of priority from Japanese Patent Application No. 2021-210887, filed Dec. 24, 2021, the entire contents of each are incorporated herein by reference.

FIELD

Embodiments described herein relate generally to a display device.

BACKGROUND

Recently, display devices to which an organic light emitting diode (OLED) is applied as a display element have been put into practical use. Such a display element comprises a pixel circuit including a thin-film transistor, a lower electrode connected to the pixel circuit, an organic layer covering the lower electrode, and an upper electrode covering the organic layer.

Generally, the pixel circuit is covered by an insulating layer made of organic material, and the lower electrode is connected to the pixel circuit through a contact hole made in this insulating layer. If elements placed above the insulating layer are deformed by the contact hole, display errors may occur. To avoid this, it is necessary to design the layout of various elements taking the contact hole into consideration in order to improve the display quality.

BRIEF DESCRIPTION OF THE DRAWINGS

FIG. 1 is a diagram showing a configuration example of a display device according to an embodiment.

FIG. 2 is a diagram showing an example of layout of subpixels in the embodiment.

DETAILED DESCRIPTION

Figure 3:
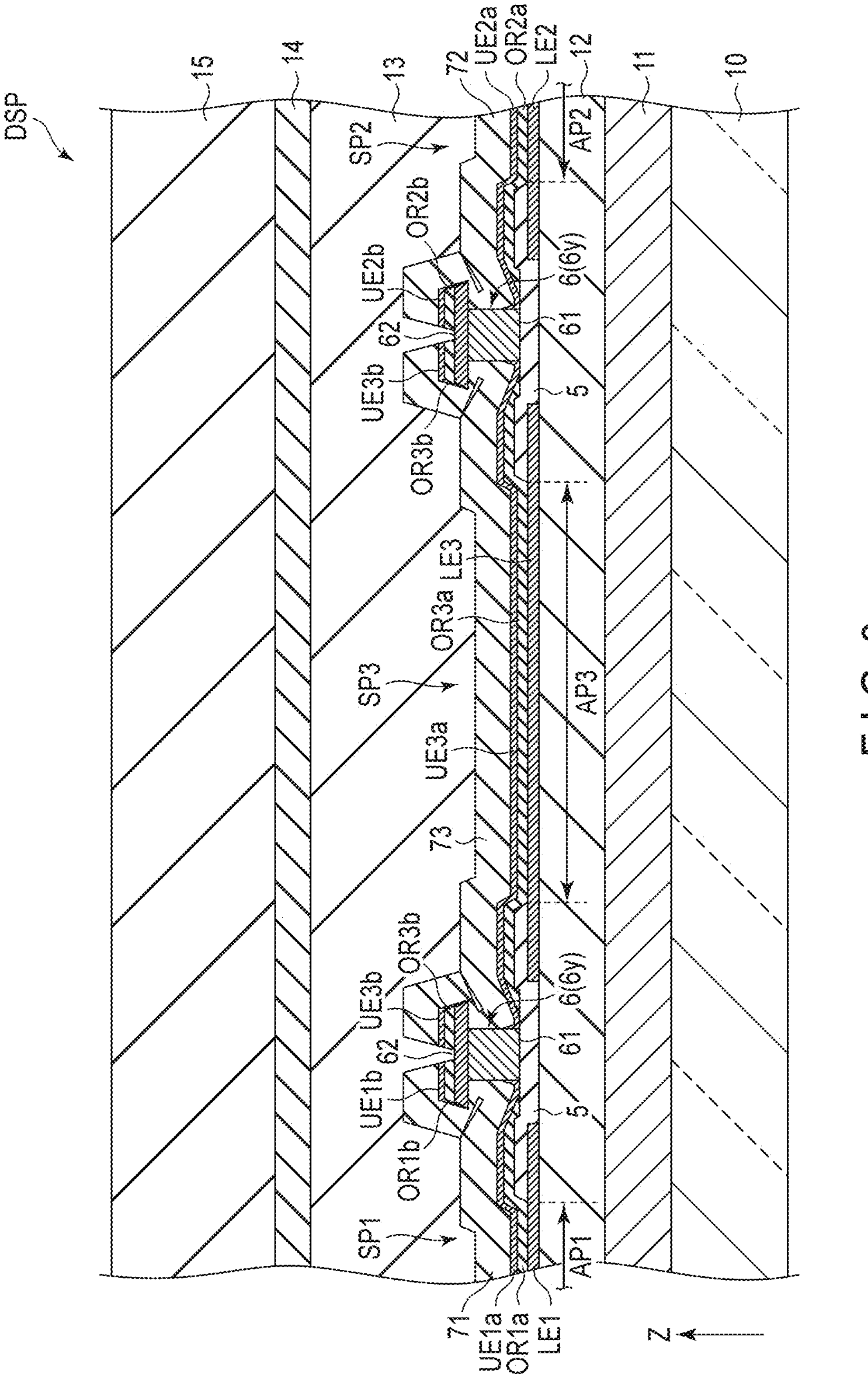
FIG. 3 is a schematic cross-sectional view of the display device taken along line III-III in FIG. 2.

In general, according to one embodiment, a display device comprises a substrate, a pixel circuit disposed above the substrate, an insulating layer which covers the pixel circuit and includes a contact hole, a lower electrode disposed above the insulating layer and connected to the pixel circuit via the contact hole, an upper electrode opposing the lower electrode, an organic layer located between the lower electrode and the upper electrode and including a light-emitting layer, a rib formed of an inorganic material and including an opening which overlaps the lower electrode and a partition disposed above the rib. The organic layer includes a first organic layer in contact with the lower electrode via the opening and a second organic layer located on the partition and spaced apart from the first organic layer. The partition overlaps an entirety of the contact hole in plan view.

According to such a configuration as described above, it is possible to provide a display device with improved display quality.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction along the X-axis is referred to as a first direction. A direction along the Y-axis is referred to as a second direction. A direction along the Z-axis is referred to as a third direction. Further, viewing the elements in parallel with the third direction is referred to as plan view.

The display device of this embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to the embodiment. The display device DSP comprises a display area DA which displays images and a surrounding area SA around the display area DA on an insulating substrate 10. The substrate 10 may be glass or a resinous film having flexibility.

In this embodiment, the shape of the substrate 10 in plan view is rectangular. But, the shape of the substrate 10 in plan view is not limited to a rectangle, but may be of some other shape such as a square, circle or oval.

The display area DA comprises a plurality of pixels PX arranged in a matrix along the first direction X and the second direction Y. The pixels PX each include a plurality of sub-pixels SP. For example, pixel PX includes a red sub-pixel SP1 (first sub-pixel), a green sub-pixel SP2(second sub-pixel) and a blue sub-pixel SP3 (third sub-pixel). Note that the pixels PX each may include a sub-pixel SP of another color, such as white, together with the sub-pixels SP1, SP2 and SP3 or in place of any of the sub-pixels SP1, SP2 and SP3.

Each sub-pixel SP comprise a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are each a switching element constituted by a thin-film transistor, for example.

A gate electrode of the pixel switch 2 is connected to a scanning line GL. One of a source electrode and a drain electrodes of the pixel switch 2 is connected to a signal line SL, and the other is connected to a gate electrode of the drive transistor 3 and the capacitor 4. In the drive transistor 3, one of a source electrode and a drain electrode is connected to a power line PL and the capacitor 4, and the other is connected to an anode of the display element 20.

Note that the configuration of the pixel circuit 1 is not limited to that of the example shown in the figure. Note that, for example, the pixel circuit 1 may comprise more thin-film transistors and capacitors.

The display element 20 is an organic light-emitting diode (OLED) as a light-emitting element. For example, the sub-pixel SP1 comprises a display element 20 which emits light in a red wavelength range, the sub-pixel SP2 comprises a display element 20 which emits light in a green wavelength range, and the sub-pixel SP3 comprises a display element 20 which emits light in a blue wavelength range.

FIG. 2 is a diagram showing an example of the layout of the sub-pixels SP1, SP2 and SP3. In the example in FIG. 2, the sub-pixel SP1 and the sub-pixel SP2 are aligned along the second direction Y. Further, the sub-pixels SP1 and SP2 are each aligned with sub-pixel SP3 along the first direction X.

When the sub-pixels SP1, SP2 and SP3 are in such a layout, the display area DA comprises columns each including sub-pixels SP1 and SP2 alternately arranged along the second direction Y and columns each including sub-pixels SP3 repeatedly arranged along the second direction Y. These columns are alternately arranged along the first direction X.

The layout of the sub-pixels SP1, SP2 and SP3 is not limited to that of the example shown in FIG. 2. As another example, the sub-pixels SP1, SP2 and SP3 in each pixel PX may be aligned in order along the first direction X.

In the display area DA, rib 5 and partition 6 are arranged. The rib 5 includes apertures AP1, AP2 and AP3 in the sub-pixels SP1, SP2 and SP3, respectively. In the example shown in FIG. 2, the aperture AP2 is larger in size than the aperture AP1, and the aperture AP3 is larger than the aperture AP2.

The partition 6 overlaps the rib 5 in plan view. The partition 6 includes a plurality of first partitions 6*x* extending along the first direction X and a plurality of second partitions 6*y* extending along the second direction Y. The first partitions 6*x* are each located between apertures AP1 and AP2 adjacent to each other along the second direction Y and between pairs of apertures AP3 adjacent to each other. The second partitions 6*y* are each located between apertures AP1 and AP3 adjacent to each other along the first direction X AP3 and between apertures AP2 and AP3 adjacent to each other along the first direction X.

In the example of FIG. 2, the first partitions 6*x* and the second partitions 6*y* are connected to each other. With this structure, the partition 6 as a whole forms a lattice-like pattern which surrounds apertures AP1, AP2 and AP3. It may as well be described that the partition 6, as in the case of the rib 5, include apertures in the sub-pixels SP1, SP2 and SP3.

The sub-pixel SP1 comprises a lower electrode LE1, an upper electrode UE1 and an organic layer OR1, each overlapping the aperture AP1. The sub-pixel SP2 comprises a lower electrode LE2, an upper electrode UE2 and an organic layer OR2, each overlapping the aperture AP2. The sub-pixel SP3 comprises a lower electrode LE3, an upper electrode UE3 and an organic layer OR3, each overlapping the aperture AP3. In the example shown in FIG. 2, outlines of the upper electrode UE1 and the organic layer OR1 match each other, outlines of the upper electrode UE2 and the organic layer OR2 match each other, and outlines of the upper electrode UE3 and the organic layer OR3 match each other.

The lower electrode LE1, the upper electrode UE1 and the organic layer OR1 constitute the display element 20 of the sub-pixel SP1. The lower electrode LE2, the upper electrode UE2 and the organic layer OR2 constitute the display element 20 of the sub-pixel SP2. The lower electrode LE3, the upper electrode UE3 and the organic layer OR3 constitute the display element 20 of the sub-pixel SP3.

The lower electrode LE1 is connected via a contact hole CH1 to the pixel circuit 1 of the sub-pixel SP1 (see FIG. 1). The lower electrode LE2 is connected to the pixel circuit 1 of the sub-pixel SP2 via a contact hole CH2. The lower electrode LE3 is connected to the pixel circuit 1 of the sub-pixel SP3 via a contact hole CH3.

The contact holes CH1 and CH2 entirely overlap the first partition 6*x* between apertures AP1 and AP2 adjacent to each other along the second direction Y. The contact hole CH3 entirely overlaps the first partition 6*x* between a pair of apertures AP3 adjacent to each other along the second direction Y.

In the example of FIG. 2, the lower electrode LE1 includes a protruding portion PR1 protruding toward the lower electrode LE2, and the lower electrode LE2 includes a protruding portion PR2 protruding toward the lower electrode LE1. The contact holes CH1 and CH2 overlap the protruding portions PR1 and PR2, respectively.

FIG. 3 is a schematic cross-sectional view of the display device DSP taken along line III-III in FIG. 2. On the substrate 10 described above, a circuit layer 11 is disposed. The circuit layer 11 contains various circuits and wiring lines such as the pixel circuit 1 shown in FIG. 1, scanning lines GL, signal lines SL and power lines PL. The circuit layer 11 is covered by an insulating layer 12. The insulating layer 12 functions as a planarization film to planarize the unevenness created by the circuit layer 11. Although not shown in the cross-section of FIG. 3, the contact holes CH1, CH2 and CH3 described above are provided in the insulating layer 12.

The lower electrodes LE1, LE2 and LE3 are located on the insulating layer 12. The rib 5 is located on the insulating layer 12 and the lower electrodes LE1, LE2 and LE3. End portions of the lower electrodes LE1, LE2 and LE3 are covered by the rib 5.

The partition 6 includes a lower portion 61 disposed above the rib 5 and an upper portion 62 which covers an upper surface of the lower portion 61. The upper portion 62 has a width greater than that of the lower portion 61. As a result, in FIG. 3, both end portions of the upper portion 62 protrude further from side surfaces of the lower portion 61. Such a shape of the partition 6 can as well be referred to as an overhang shape.

The organic layer OR1 shown in FIG. 2 includes a first organic layer OR1*a* and a second organic layer OR1*b*, which are spaced from each other. Further, the upper electrode UE1 shown in FIG. 2 includes a first upper electrode UE1*a* and a second upper electrode UE1*b*, which are spaced from each other. As shown in FIG. 3, the first organic layer OR1*a* is in contact with the lower electrode LE1 via the aperture AP1 and also covers a part of the rib 5. The second organic layer OR1*b* is located on the upper portion 62. The first upper electrode UE1*a* opposes the lower electrode LE1 and also covers the first organic layer OR1*a*. Further, the first upper electrode UE1*a* is in contact with a side surface of the lower portion 61. The second upper electrode UE1*b* is located above the partition 6 and covers the second organic layer OR1*b*.

The organic layer OR2 shown in FIG. 2 includes a first organic layer OR2*a* and a second organic layer OR2*b*, which are spaced from each other. The upper electrode UE2 shown in FIG. 2 also includes a first upper electrode UE2*a* and a second upper electrode UE2*b*, which are spaced from each other. As shown in FIG. 3, the first organic layer OR2*a* is in contact with the lower electrode LE2 via the aperture AP2 and also covers a part of the rib 5. The second organic layer OR2*b* is located on the upper portion 62. The first upper electrode UE2*a* opposes the lower electrode LE2 and also covers the first organic layer OR2*a*. Further, the first upper electrode UE2*a* is in contact with a side surface of the lower portion 61. The second upper electrode UE2*b* is located above the partition 6 and covers the second organic layer OR2*b*.

The organic layer OR3 shown in FIG. 2 includes of a first organic layer OR3*a* and a second organic layer OR3*b*, which are spaced from each other. Further, the upper electrode UE3 shown in FIG. 2 includes a first upper electrode UE3*a* and a second upper electrode UE3*b*, which are spaced from each other. As shown in FIG. 3, the first organic layer OR3*a* is in contact with the lower electrode LE3 via the aperture AP3 and also covers a part of the rib 5. The second organic layer OR3*b* is located on the upper portion 62. The first upper electrode UE3*a* opposes the lower electrode LE3 and also covers the first organic layer OR3*a*. Further, the first upper electrode UE3*a* is in contact with a side surface of the lower portion 61. The second upper electrode UE3*b* is located above the partition 6 and covers the second organic layer OR3*b*.

In the sub-pixels SP1, SP2 and SP3, sealing layers 71, 72 and 73 are disposed, respectively. The sealing layer 71 continuously covers the first upper electrode UE1*a*, the side surface of the lower portion 61 and the second upper electrode UE1*b*. The sealing layer 72 continuously covers the first upper electrode UE2*a*, the side surface of the lower portion 61 and the second upper electrode UE2*b*. The sealing layer 73 continuously covers the first upper electrode UE3*a*, the side surface of the lower portion 61 and the second upper electrode UE3*b*.

In the example of FIG. 3, the second organic layer OR1*b*, the second upper electrode UE1*b* and the sealing layer 71 on the partition 6 between the sub-pixels SP1 and SP3 are spaced from the second organic layer OR3*b*, the second upper electrode UE3*b* and the sealing layer 73 on the same partition 6. Further, the second organic layer OR2*b*, the second upper electrode UE2*b* and the sealing layer 72 on the partition 6 between the sub-pixels SP2 and SP3 are spaced from the second organic layer OR3*b*, the second organic layer OR3*b* and the sealing layer 73 on the same partition 6.

The sealing layers 71, 72 and 73 are covered by a resin layer 13. The resin layer 13 is covered by the sealing layer 14. Further, the sealing layer 14 is covered by a resin layer 15.

The insulating layer 12 and the resin layers 13 and 15 are each formed of an organic material. The rib 5 and the sealing layers 14, 71, 72 and 73 are each made of, for example, an inorganic material such as silicon nitride (SiNx). The rib 5, which is formed of an inorganic material, has a thickness sufficiently small compared to those of the thicknesses of the partition 6 and the insulating layer 12. For example, the thickness of the rib 5 is 200 nm or more and 400 nm or less.

The lower portion 61 of the partition 6 is electro conductive. The upper portion 62 of the partition 6 may as well be electro conductive.

The lower electrodes LE1, LE2 and LE3 may be formed of a transparent conductive material such as ITO, or may have a multi-layered structure in which a metal material such as silver (Ag) and a transparent conductive material are stacked one on another. The upper electrodes UE1, UE2 and UE3 may be made of, for example, a metal material such as an alloy of magnesium and silver (MgAg). The upper electrodes UE1, UE2 and UE3 may be formed of a transparent conductive material such as ITO.

When the potential of the lower electrodes LE1, LE2 and LE3 is relatively higher than that of the upper electrodes UE1, UE2 and UE3, the lower electrodes LE1, LE2 and LE3 are equivalent to anodes, respectively, and the upper electrodes UE1, UE2 and UE3 are equivalent to cathodes, respectively. Further, when the potential of the upper electrodes UE1, UE2 and UE3 is relatively higher than that of the lower electrodes LE1, LE2 and LE3, the upper electrodes UE1, UE2 and UE3 are equivalent to anodes, respectively, and the lower electrodes LE1, LE2 and LE3 are equivalent to cathodes, respectively.

The organic layers OR1, OR2 and OR3 each includes a pair of functional layers and a light-emitting layer disposed between these functional layers. For example, the organic layers OR1, OR2 and OR3 have a configuration in which a hole injection layer, a hole transport layer, an electron blocking layer, an emission layer, a hole blocking layer, an electron transport layer and an electron injection layer are stacked in this order.

The sub-pixels SP1, SP2 and SP3 may further include a cap layer configured to adjust optical properties of the light emitted by the light-emitting layers of the organic layers OR1, OR2 and OR3. Such a cap layer may be formed between the upper electrode UE1 and the sealing layer 71, between the upper electrode UE2 and the sealing layer 72, and between the upper electrode UE3 and the sealing layer 73.

To the partition 6, a common voltage is supplied. The common voltage is supplied to each of the first upper electrodes UE1*a*, UE2*a* and UE3*a* which are in contact with the side surfaces of the lower portions 61. To the lower electrodes LE1, LE2 and LE3, pixel voltages are supplied through the pixel circuits 1 of the sub-pixels SP1, SP2 and SP3, respectively.

When a potential difference is formed between the lower electrode LE1 and the upper electrode UE1, the light-emitting layer of the first organic layer OR1*a* emits light of the red wavelength range. When a potential difference is formed between the lower electrode LE2 and the upper electrode UE2, the light-emitting layer of the first organic layer OR2*a* emits light of the green wavelength range. When a potential difference is formed between the lower electrode LE3 and the upper electrode UE3, the light-emitting layer of the first organic layer OR3*a* emits light of the blue wavelength range.

As another example, the emitting layers of the organic layers OR1, OR2 and OR3 may emit light of the same color (for example, white). In this case, the display device DSP may comprise color filters which convert the light emitted by the light-emitting layers into light of colors corresponding to those of the sub-pixels SP1, SP2 and SP3. Further, the display device DSP may comprise layers containing quantum dots which generate light of colors corresponding to those of the sub-pixels SP1, SP2 and SP3, as they are excited by the light emitted by the light-emitting layers.

Figure 4:
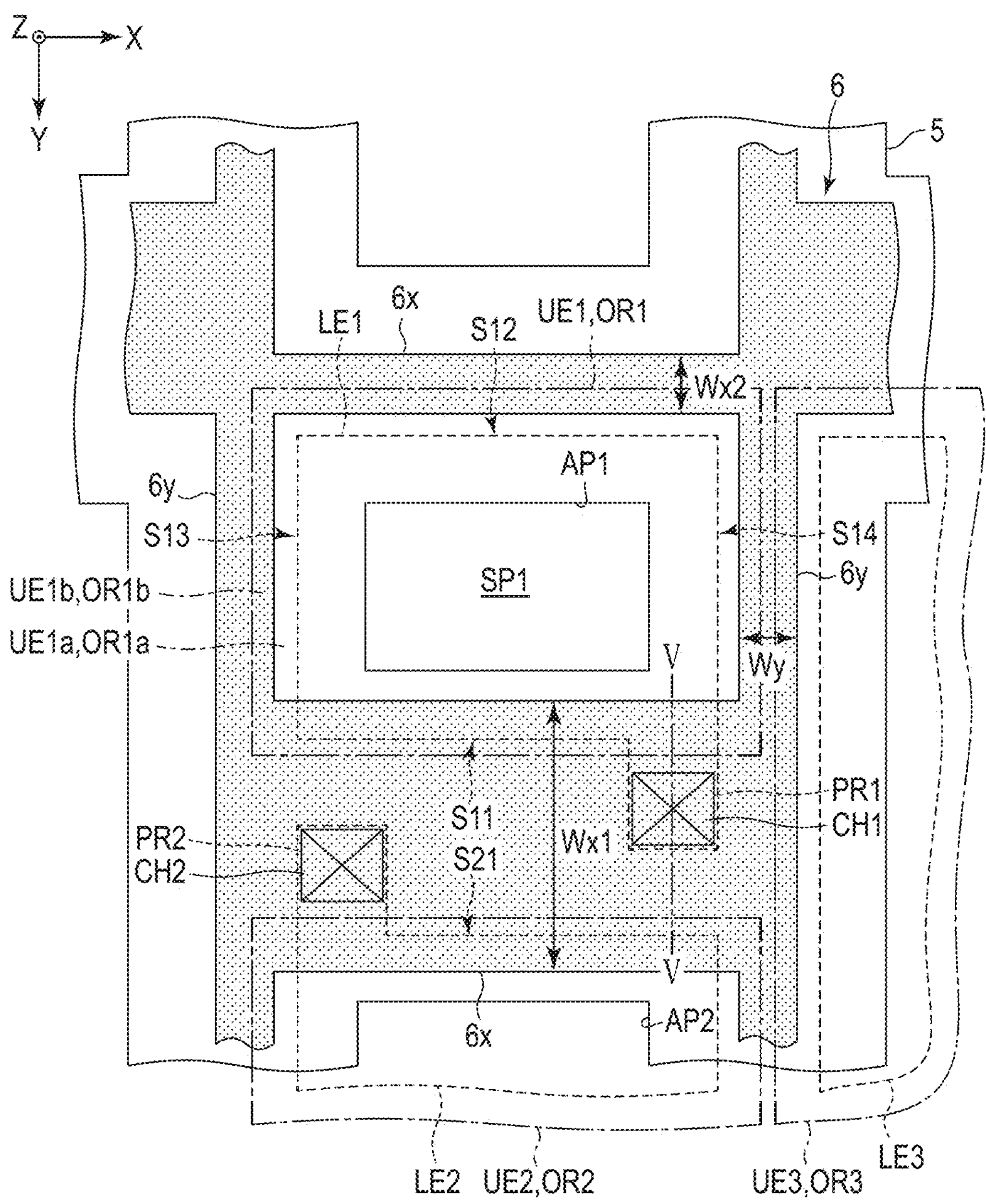
FIG. 4 is a partially enlarged schematic plan view of the drawing of FIG. 2.

FIG. 4 is a partially enlarged schematic plan view of the vicinity of the sub-pixel SP1 in FIG. 2. Of the region enclosed by the chain lines showing the outline of the upper electrode UE1 and the organic layer OR1, the portion overlapping the partition 6 is equivalent to the second upper electrode UE1*b* and the second organic layer OR1*b* described above. Further, of the region enclosed by the chain line, the portions located on an inner side of the second upper electrode UE1*b* and the second organic layer OR1*b* are equivalent to the first upper electrode UE1*a* and the first organic layer OR1*a*, described above.

The second upper electrode UE1*b* and the second organic layer OR1*b* surround the first upper electrode UE1*a*, the first organic layer OR1*a* and the aperture AP1. Similarly, the second upper electrode UE2*b* and the second organic layer OR2*b* shown in FIG. 3 surround the first upper electrode UE2*a*, the first organic layer OR2*a* and the aperture AP2. Further, the second upper electrode UE3*b* and the second organic layer OR3*b* shown in FIG. 3 surround the first upper electrode UE3*a*, the first organic layer OR3*a* and the aperture AP3.

In this embodiment, the entire contact hole CH1 overlaps the respective first partitions 6*x*. The contact hole CH1 is located between the organic layers OR1 and OR2 (or between the upper electrodes UE1 and UE2) in the second direction Y.

The first partition 6*x* which overlaps the contact hole CH1 has a width Wx1 along the second direction Y. The first partition 6*x* which do not overlap with the contact hole CH1 (the upper first partition 6*x* in the figure) has a width Wx2. Each of the second partitions 6*y* has a width Wy along the first direction X. In the example in FIG. 4, the width Wx1 is greater than the width Wx2 or the width Wy (Wx1>Wx2, Wy). For example, the width Wy is equal to the width Wx2.

The lower electrode LE1 includes a first side S11 and a second side S12, parallel to the first direction X1, and a third side S13 and a fourth side S14, parallel to the second direction Y. The first side S11 is located between the contact hole CH1 and the aperture AP1 and overlaps the first partition 6*x* in the lower part of the figure. The protruding portion PR1 protrudes from the first side S11 toward the lower electrode LE2 and overlaps the contact hole CH1. In the example of FIG. 4, the second side S12 does not overlap the partition 6. Further, most of the third side S13 and the fourth side S14 do not overlap the partition 6.

The first partition 6*x*, which the contact hole CH1 overlaps, also overlaps the entire contact hole CH2. The contact hole CH2 is located between the organic layers OR1 and OR2 (or between the upper electrodes UE1 and UE2) along the second direction Y. The contact holes CH1 and CH2 are aligned along the first direction X. The lower electrode LE2 includes a first side S21 which overlaps the first partition 6*x*. The other side of the lower electrode LE2 mostly does not overlap the partition 6 like each of the sides S12, S13 and S14. The protruding portion PR2 protrudes from the first side S21 toward the lower electrode LE1 and overlaps the contact hole CH2. Although not shown in FIG. 4, similar to the case of the lower electrode LE3, one side close to the contact hole CH3 overlaps the first partition 6*x*, and most of the other sides do not overlap the partition 6.

Figure 5:
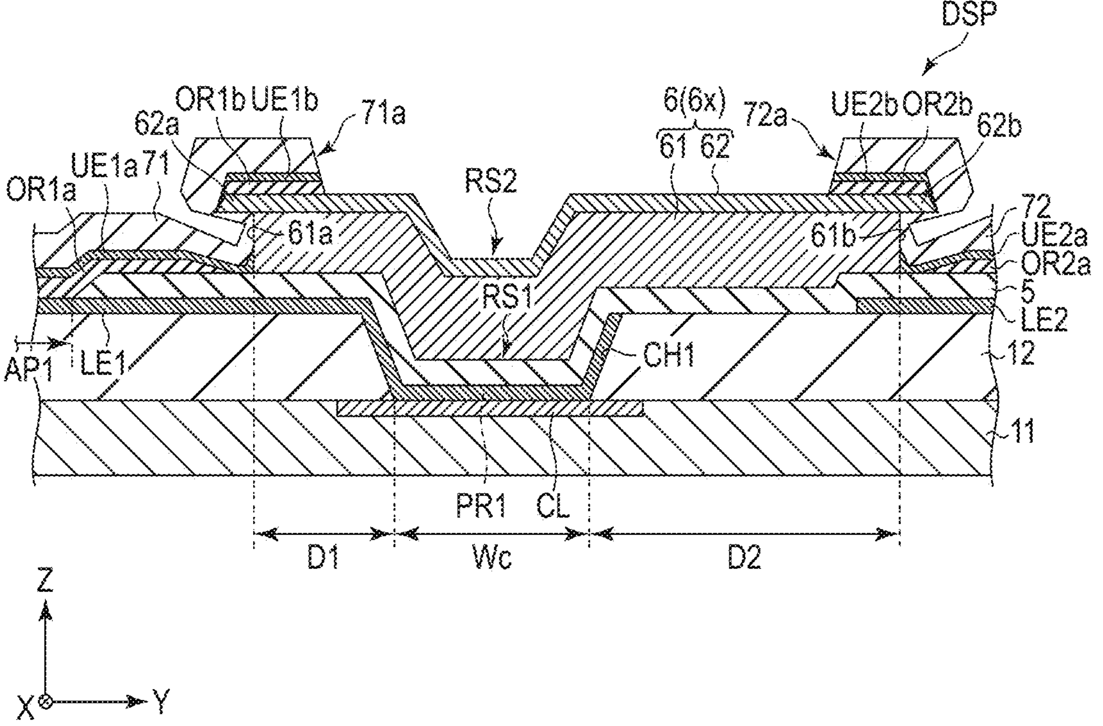
FIG. 5 is a schematic cross-sectional view of the display device taken along line V-V in FIG. 4.

FIG. 5 is a schematic cross-sectional view of the display device DSP taken along line V-V in FIG. 4. In this figure, the substrate 10, the resin layers 13 and 15 and the sealing layer 14 shown in FIG. 3 are omitted.

The contact hole CH1 penetrates the insulating layer 12. The protruding portion PR1 of the lower electrode LE1 is in contact with the conductive layer CL included in the circuit layer 11 via the contact hole CH1. The conductive layer CL is equivalent, for example, to the source or drain electrode of the drive transistor 3 shown in FIG. 1.

The lower portion 61 of the first partition 6*x* (the partition 6) includes side surfaces 61*a* and 61*b*. The first upper electrode UE1*a* is in contact with a part of the side surface 61*a*. The other part of the side surface 61*a* is covered by the sealing layer 71. Similarly, the first upper electrode UE2*a* is in contact with a part of the side surface 61*b*. The other part of the side surface 61*b* is covered by the sealing layer 72.

The upper portion 62 of the first partition 6*x* includes an end portion 62*a* protruding from the side surface 61*a* and an end portion 62*b* protruding from side surface 61*b*. In the example of FIG. 5, the sealing layer 71 covers the lower surface of the end portion 62*a*, and the sealing layer 72 covers the lower surface of the end portion 62*b*.

The second organic layers OR1*b* and OR2*b* located on the first partitions 6*x* are spaced apart along the second direction Y. Similarly, the second upper electrodes UE1*b* and UE2*b* located on the first partition 6*x* are spaced apart along the second direction Y. Further, the end portion 71*a* of the sealing layer 71 and the end portion 72*a* of the sealing layer 72 are located on the first partitions 6*x*, respectively, and are spaced apart along the second direction Y.

In this embodiment, the rib 5 is sufficiently thin as compared to the insulating layer 12, and therefore the rib 5 is depressed above the contact hole CH1 to form a recess portion RS1. Further, the first partition 6*x* placed on the rib 5 is also depressed above the contact hole CH1, to form a recess RS2.

The side surface 61*a* is located on an outer side of the recess RS1. That is, the lower portion 61 entirely covers the inner surface of the recessed portion RS1 and also covers the flat upper surface of the respective rib 5 around the recess portion RS1.

The side surface 61*a* is located between the contact hole CH1 and the aperture AP1 along the second direction Y. The side surface 61*b* is located between the contact hole CH2 and the aperture AP2 along the second direction Y (see FIG. 4).

Here, the distance between the side surface 61*a* and the contact hole CH1 (the opening in a lower surface of the insulating layer 12) is defined as D1, the distance between the side surface 61*b* and the contact hole CH1 (the opening mentioned above) is defined as D2, and the width of the contact hole CH1 along the second direction Y (the opening above) is defined as Wc.

The distance D1 is, for example, 2.0 μm or more, and preferably 4.5 μm or more. The width Wc is, for example, 3 μm or more and 5 μm or less. In the example of FIG. 5, the width Wc is larger than the distance D1 and the distance D2 is larger than the width Wc (D1<Wc<D2). The configuration is not limited to this, but, for example, the distance D1 may be larger than the width Wc.

The cross-sectional configuration in the vicinity of the contact holes CH2 and CH3 is similar to that of the contact hole CH1 shown in FIG. 5. In other words, the distance between the contact holes CH2 and CH3 and the side surfaces 61*a* and 61*b* of the first partitions 6*x*, which overlap these holes is, for example, 2.0 μm or more, and preferably 4.5 μm or more.

Here, one example of the advantageous effects of this embodiment will now be explained using FIGS. 6 and 7.

Figure 6:
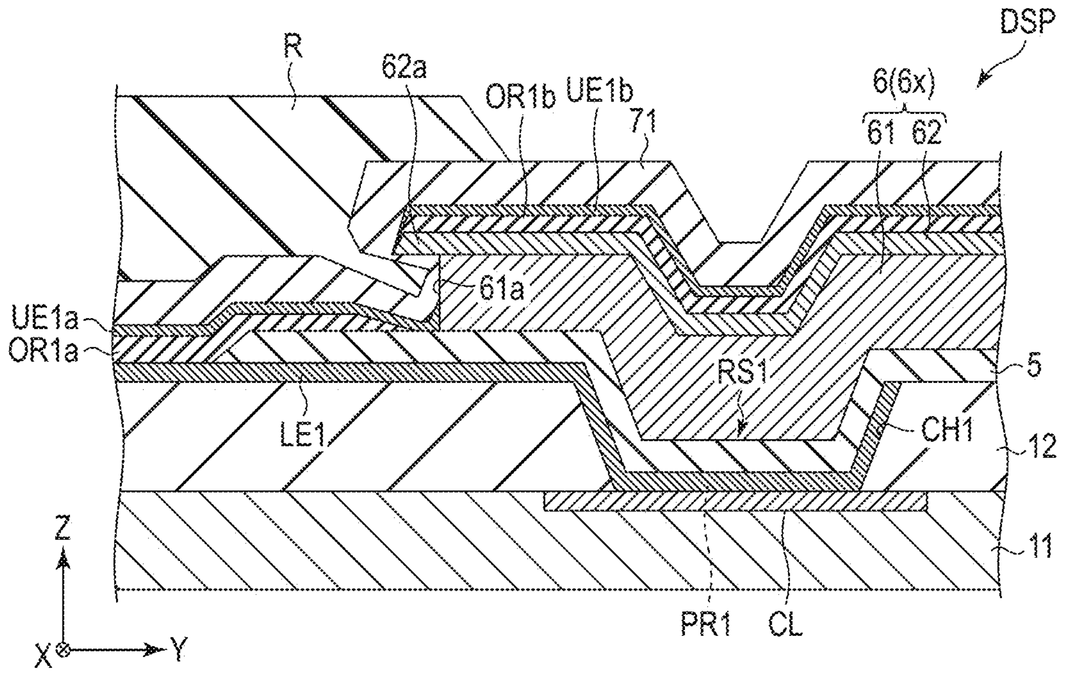
FIG. 6 is a schematic cross-sectional view showing a part of a manufacturing process of the display device in the embodiment.

FIG. 6 is a schematic cross-sectional view showing a part of the manufacturing process of the display device DSP. In the formation of the organic layer OR1, first, a base material of the organic layer OR1 is deposited over the entire display area DA. At this time, the material is divided into the first organic layer OR1*a* and the second organic layer OR1*b* by the partition 6. Next, a base material of the upper electrode UE1 is deposited over the entire display area DA. At this time, the material is divided into the first upper electrode UE1*a* and the second upper electrode UE1*b* by the partition 6.

Further, the sealing layer 71 is formed on the first upper electrode UE1*a* and the second upper electrode UE1*b*, and a resist R is formed on the sealing layer 71 in the region where the first organic layer OR1*a*, the second organic layer OR1*b*, the first upper electrode UE1*a* and the second upper electrode UE1*b* are to be finally left to remain. After that, etching is carried out to remove the portions of the first organic layer OR1*a*, the second organic layer OR1*b*, the first upper electrode UE1*a*, the second upper electrode UE1*b* and the sealing layer 71, which are not covered by the resist R.

Figure 7:
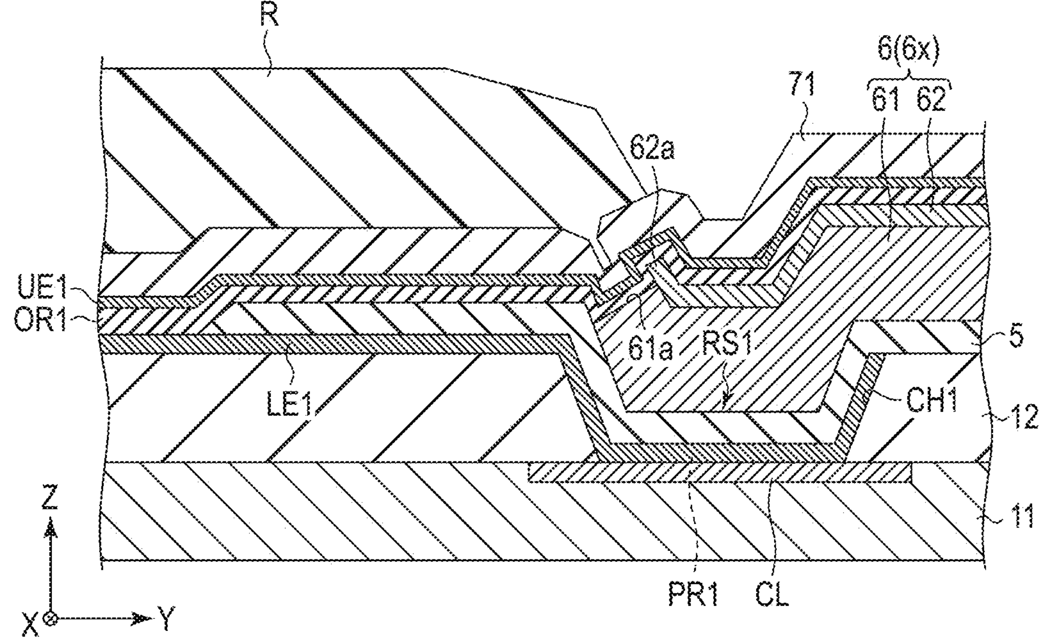
FIG. 7 is a schematic cross-sectional view showing a display device according to a comparative example.

FIG. 7 is a schematic cross-sectional view of a display device according to a comparative example, which illustrates a manufacturing process similar to that of FIG. 6. In this comparative example, the first partition 6*x* does not entirely overlap the contact hole CH1. Therefore, the side surface 61*a* of the lower portion 61 is located inside the recess portion RS1 of the rib 5.

In the configuration of the comparative example, the end portion 62*a* of the upper portion 62 faces upward as compared to the configuration of FIG. 6, and therefore the organic layer OR1 and the upper electrode UE1 may not be divided by the first partition 6*x*. In this case, when a resist R is formed and then etching is carried out, the end portion of the organic layer OR1, which constitutes the display element, is exposed from the upper electrode UE1 and the sealing layer 71. In general, the organic layer OR1 has low resistance to moisture. Therefore, if moisture enters the organic layer OR1 via the exposed end portion, display errors may occur.

By contrast, in this embodiment, the entire contact hole CH1 overlaps the first partition 6*x*. With this structure, even in the vicinity of the contact hole CH1, the organic layer OR1 is divided into the first organic layer OR1*a* and the second organic layer OR1*b*. In this case, the end portion of the first organic layer OR1*a* is effectively covered by the first upper electrode UE1*a* and the sealing layer 71, and the entering of moisture to the first organic layer OR1*a* is suppressed. As a result, display errors are suppressed and the display quality of the display device DSP is improved.

As described above, when the distance D1 between the side surface 61*a* and the contact hole CH1 is 2.0 μm or more, the shape of the first partition 6*x* in the vicinity of the side surface 61*a* is sufficiently stabilized. When the distance D1 is 4.5 μm or more, the shape becomes more appropriate.

Note that in FIGS. 5 and 6, the organic layer OR1 is focused on, but similar effects can be obtained for the organic layers OR2 and OR3.

As shown in FIGS. 2 and 4, when the width of the first partition 6*x* which overlap the contact holes CH1, CH2 and CH3 is larger than the width Wx2 of another first partition 6*x* or the width Wy of the second partition 6*y*, it is easier to ensure a sufficient distance between the contact holes CH1, CH2 and CH3 and the side surface of the lower portion 61. From another point of view, the widths of the first partition 6*x* and the second partition 6*y* which do not overlap the contact holes CH1, CH2 and CH3, are reduced, and therefore, the areas of the apertures AP1, AP2 and AP3 can be increased.

When the lower electrodes LE1 and LE2 include protruding portions PR1 and PR2, the contact holes CH1 and CH2 can be aligned along the first direction X as shown in FIGS. 2 and 4. With this configuration, the width Wx1 of the first partition 6*x* can be reduced while maintaining a sufficient distance between the contact holes CH1 and CH2 and the side surface of the lower portion 61.

Based on the display device described above as an embodiment of the present invention, all display devices that can be designed and modified as appropriate by a person skilled in the art to implement the present invention also fall within the scope of the present invention insofar as they encompass the gist of the invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each of the above embodiments and modified examples and are self-explanatory from the descriptions of the specification or can be arbitrarily conceived by a person of ordinary skill in the art are considered to be naturally brought about by the present invention as a matter of course.

What is claimed is:

1. A display device comprising:
- a substrate;
- a pixel circuit overlapping the substrate;
- an insulating layer on the pixel circuit and including a contact hole;
- a first lower electrode and a second lower electrode on the insulating layer and arranged in a second direction crossing at a right angle to a third direction normal to an upper surface of the substrate;
- a first upper electrode opposing the first lower electrode in the third direction;
- a second upper electrode opposing the second lower electrode in the third direction;
- a first organic layer located between the first lower electrode and the first upper electrode and including a first light-emitting layer;
- a second organic layer located between the second lower electrode and the second upper electrode and including a second light-emitting layer;
- a rib formed of a first inorganic material on the first lower electrode and the second lower electrode and including:
  - a first pixel aperture overlapping the first lower electrode in a plan view, and
  - a second pixel aperture overlapping the second lower electrode in the plan view;
- a partition located between the first pixel aperture and the second pixel aperture in the plan view, a thickness of the rib being less than a thickness of the partition, and the partition including a lower portion on the rib, and
- an upper portion on the lower portion and extending beyond a side surface of the lower portion in the second direction, wherein the first light-emitting layer emits a light of a first color, the second light-emitting layer emits a light of a second color different from the first color, the contact hole includes a contact area where the first lower electrode is in electrical contact with the pixel circuit, the lower portion of the partition overlaps an entirety of the contact area of the contact hole, the rib includes:

a lower surface in direct contact with the first lower electrode and the second lower electrode, an upper surface opposing the lower surface, the upper surface being further from the substrate compared to the lower surface in the third direction and including a first portion and a second portion, and a side surface connecting the lower surface to the upper surface, no part of the upper surface of the rib is in direct contact with the first lower electrode and no part of the upper surface of the rib is in direct contact with the second lower electrode, the second portion of the upper surface of the rib is closer to the substrate compared to the first portion of the upper surface of the rib in the third direction, and the second portion of the upper surface of the rib overlaps the contact area of the contact hole in the third direction.

2. The display device according to claim 1, wherein, in a cross-sectional view, the side surface of the lower portion of the partition includes a first side surface and a second side surface, the first side surface being closer to the first pixel aperture compared to the second side surface in the second direction, the first upper electrode and the second upper electrode are spaced apart from each other and separated by the partition, the first upper electrode is in direct contact with the first side surface of the lower portion of the partition at a first contact portion, the second upper electrode is in direct contact with the second side surface of the lower portion of the partition at a second contact portion, the first contact portion is located between the contact area of the contact hole and the first organic layer in the second direction, and the second contact portion is located between the contact area of the contact hole and the second organic layer in the second direction.

3. The display device according to claim 2, further comprising:

a first sealing layer formed of a second inorganic material and covering the first upper electrode and the first side surface of the lower portion of the partition, a second sealing layer formed of a third inorganic material and covering the second upper electrode and the second side surface of the lower portion of the partition, the first sealing layer and the second sealing layer are spaced apart from each other in the second direction, the first sealing layer is in direct contact with the first side surface of the lower portion of the partition at a third contact portion, the second sealing layer is in direct contact with the second side surface of the lower portion of the partition at a fourth contact portion, the third contact portion is located between the contact area of the contact hole and the first organic layer in the second direction, and the fourth contact portion is located between the contact area of the contact hole and the second organic layer in the second direction.

4. The display device according to claim 3, wherein the first contact portion, the second contact portion, the third contact portion, and the fourth contact portion overlap the first portion of the upper surface of the rib in the third direction and do not overlap the second portion of the upper surface of the rib in the third direction.

5. The display device according to claim 2, wherein the first contact portion is located between the second portion of the upper surface of the rib and the first organic layer in the second direction, and the second contact portion is located between the second portion of the upper surface of the rib and the second organic layer in the second direction.

6. The display device according to claim 1, wherein the side surface of the lower portion of the partition includes a first side surface and a second side surface, the first side surface being closer to the first pixel aperture compared to the second side surface in the second direction, the first side surface of the lower portion of the partition overlaps the first portion of the upper surface of the rib in the third direction, and the first side surface of the lower portion of the partition does not overlap the second portion of the upper surface of the rib in the third direction.

7. The display device according to claim 6, wherein the second side surface of the lower portion of the partition overlaps the first portion of the upper surface of the rib in the third direction, and the second side surface of the lower portion of the partition does not overlap the second portion of the upper surface of the rib in the third direction.

8. The display device according to claim 1, wherein the lower portion of the partition further includes:

a lower surface in direct contact with the upper surface of the rib, and an upper surface opposing the lower surface, being further from the substrate compared to the lower surface in the third direction, and including a third portion and a fourth portion, the side surface of the lower portion of the partition connects the lower surface of the lower portion of the partition to the upper surface of the lower portion of the partition, no part of the lower surface of the lower portion of the partition is in direct contact with the upper surface of the lower portion of the partition, the fourth portion of the upper surface of the lower portion of the partition is closer to the substrate compared to the third portion of the upper surface of the lower portion of the partition in the third direction, and the fourth portion of the upper surface of the lower portion of the partition overlaps the contact area of the contact hole in the third direction.

9. The display device according to claim 8, wherein the upper portion of the partition includes:

a lower surface in direct contact with the upper surface of the lower portion of the partition, an upper surface opposing the lower surface, being further from the substrate compared to the lower surface in the third direction, and including a fifth portion and a sixth portion, and a side surface connecting the lower surface to the upper surface, no part of the lower surface of the upper portion of the partition is in direct contact with the upper surface of the upper portion of the partition, the sixth portion of the upper surface of the upper portion of the partition is closer to the substrate compared to the fifth portion of the upper surface of the upper portion of the partition in the third direction, and the sixth portion of the upper surface of the upper portion of the partition overlaps the contact area of the contact hole in the third direction.

10. The display device according to claim 9, wherein the side surface of the lower portion of the partition includes a first side surface and a second side surface, the first side surface being closer to the first pixel aperture compared to the second side surface in the second direction, the first side surface of the lower portion of the partition and the second side surface of the lower portion of the partition overlap the first portion of the upper surface of the rib in the third direction, the first side surface of the lower portion of the partition and the second side surface of the lower portion of the partition do not overlap the second portion of the upper surface of the rib in the third direction, the first side surface of the lower portion of the partition and the second side surface of the lower portion of the partition overlap the fifth portion of the upper surface of the upper portion of the partition in the third direction, and the first side surface of the lower portion of the partition and the second side surface of the lower portion of the partition do not overlap the sixth portion of the upper surface of the upper portion of the partition in the third direction.

11. The display device according to claim 9, wherein an entirety of the fifth portion of the upper surface of the upper portion of the partition and an entirety of the sixth portion of the upper surface of the upper portion of the partition extend parallel to the second direction.

12. The display device according to claim 9, wherein an entirety of the side surface of the upper portion of the partition extends in an inclined manner with respect to the second direction.

13. The display device according to claim 12, wherein the side surface of the upper portion of the partition overlaps the first portion of the upper surface of the rib in the third direction, and the side surface of the upper portion of the partition does not overlap the second portion of the upper surface of the rib in the third direction.

14. The display device according to claim 12, wherein the side surface of the lower portion of the partition is located between the side surface of the upper portion of the partition and the contact area of the contact hole in the second direction.

15. The display device according to claim 12, further comprising:

a first sealing layer formed of a second inorganic material and covering the first upper electrode, the side surface of the lower portion of the partition, and a part of the upper portion of the partition, a third organic layer located between the upper portion of the partition and the first sealing layer, the third organic layer including a same material as the first organic layer, wherein the third organic layer includes:

a first portion in direct contact with the upper surface of the upper portion of the partition, and a second portion in direct contact with the side surface of the upper portion of the partition, and the second portion of the third organic layer is located between the first pixel aperture and the contact area of the contact hole in the second direction.

16. The display device according to claim 15, wherein a first thickness of the first portion of the third organic layer is greater than a second thickness of the second portion of the third organic layer.

17. The display device according to claim 16, wherein the first thickness of the first portion of the third organic layer is a thickness in the third direction, and the second thickness of the second portion of the third organic layer is a thickness in a direction perpendicular to the side surface of the upper portion of the partition.

18. The display device according to claim 8, wherein an entirety of the third portion of the upper surface of the lower portion of the partition and an entirety of the fourth portion of the upper surface of the lower portion of the partition extend parallel to the second direction.

19. The display device according to claim 1, wherein an entirety of the first portion of the upper surface of the rib and an entirety of the second portion of the upper surface of the rib extend parallel to the second direction.

20. The display device according to claim 19, wherein an entirety of the side surface of the rib extends in an inclined manner with respect to the second direction.

* * * * *